(12) United States Patent
Hwang et al.

(10) Patent No.: US 8,526,248 B2
(45) Date of Patent: Sep. 3, 2013

(54) SEMICONDUCTOR MEMORY APPARATUS

(75) Inventors: Jeong Tae Hwang, Ichon-shi (KR); Kang Youl Lee, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 193 days.

(21) Appl. No.: 13/162,745

(22) Filed: Jun. 17, 2011

(65) Prior Publication Data
US 2012/0155199 A1    Jun. 21, 2012

(30) Foreign Application Priority Data
Dec. 21, 2010    (KR) .................. 10-2010-0131995

(51) Int. Cl.
*G11C 7/00*    (2006.01)

(52) U.S. Cl.
USPC .......................................... 365/193; 365/191

(58) Field of Classification Search
USPC .................................................. 365/193, 191
See application file for complete search history.

(56) References Cited

U.S. PATENT DOCUMENTS
2002/0175406 A1 * 11/2002 Callahan ...................... 257/734
2005/0263811 A1 * 12/2005 Noda et al. .................... 257/296
2006/0233012 A1 * 10/2006 Sekiguchi et al. .............. 365/51

FOREIGN PATENT DOCUMENTS
KR    1019980039922 A    8/1998
KR    1020030074893 A    9/2003

* cited by examiner

*Primary Examiner* — Vu Le
(74) *Attorney, Agent, or Firm* — William Park & Associates Patent Ltd.

(57) ABSTRACT

A semiconductor memory apparatus may include a bonding pad; a control signal pad; and an operation mode signal generation unit configured to generate a plurality of operation mode signals in response to a bonding signal inputted through the bonding pad and a control signal inputted through the control signal pad.

17 Claims, 3 Drawing Sheets

SEMICONDUCTOR MEMORY APPARATUS

CROSS-REFERENCES TO RELATED APPLICATION

The present application claims priority under 35 U.S.C. §119(a) to Korean Patent Application No. 10-2010-0131995, filed on Dec. 21, 2010, in the Korean Intellectual Property Office, which is incorporated herein by reference in its entirety as if set forth in full.

BACKGROUND

1. Technical Field

Various embodiments of the present invention relate to a semiconductor memory apparatus. In particular, certain embodiments relate to a semiconductor memory apparatus which is capable of setting its operation mode with a reduced number of bonding pads.

2. Related Art

As the operation speed and the processing capacity of a semiconductor memory apparatus increase, the semiconductor memory apparatus begin to be equipped with a plurality of pads and a plurality of data input/output lines to input and output a plurality of data at a time. X4, X8 and X16 input/output modes are used depending upon how many data bits a semiconductor memory apparatus can simultaneously process per one read or write operation. The X4 input/output mode may mean a mode in which four data bits are simultaneously inputted or outputted per one read or write operation, and the X8 and X16 input/output modes may mean modes in which eight and sixteen data bits are simultaneously inputted or outputted per one read or write operation.

In order to improve the productivity of intact products, a wafer burn-in test is generally performed during a fabrication process of a semiconductor memory apparatus. The wafer burn-in test may mean a test in which a stress is constantly applied while the semiconductor memory apparatus is on a wafer before being packaged so normality or abnormality of the semiconductor memory apparatus is inspected. The wafer burn-in test is performed separate from a regular operation of the semiconductor memory apparatus. Therefore, the semiconductor memory apparatus includes a configuration capable of designating an input/output mode and a wafer burn-in test mode.

FIG. 1 is a diagram schematically illustrating the configuration of a related-art semiconductor memory apparatus. As shown in FIG. 1, the semiconductor memory apparatus may include a first bonding pad 10, a second bonding pad 20, and a decoding unit 30. The first bonding pad 10 receives a first bonding signal PADX4, and the second bonding pad 20 receives a second bonding signal PADX8. The decoding unit 30 is configured to receive the first and second bonding signals PADX4 and PADX8 from the first and second bonding pads 10 and 20 and decode the first and second bonding signals PADX4 and PADX8. Four decoding signals may be generated based on various combinations of logic levels of the first and second bonding signals PADX4 and PADX8. The four decoding signals may be used as signals X4, X8, X16 and WBI which respectively designate an X4 input/output mode, an X8 input/output mode, an X16 input/output mode, and a wafer burn-in test mode.

Therefore, in order to designate the X4, X8 and X16 input/output modes and the wafer burn-in test mode in the conventional semiconductor memory apparatus, it is necessary to receive signals from at least two bonding pads. Also, even in a semiconductor memory apparatus in which the X4 input/output mode is not used, two signals should be received from at least two bonding pads to designate different three operation modes.

SUMMARY

Accordingly, there is a need for an improved semiconductor memory apparatus which is capable of designating its operation mode using a reduced number of bonding pads.

To attain the advantages and in accordance with the purposes of the invention, as embodied and broadly described herein, one exemplary aspect of the present invention may provide a semiconductor memory apparatus which comprises: a bonding pad; a control signal pad; and an operation mode signal generation unit configured to generate a plurality of operation mode signals in response to a bonding signal inputted through the bonding pad and a control signal inputted through the control signal pad.

In another exemplary aspect of the present invention, a semiconductor memory apparatus may include: a bonding pad; an address pad; a strobe pad; and an operation mode signal generation unit configured to determine first to fourth operation modes in response to a bonding signal inputted through the bonding pad, an address signal inputted through the address pad, and a strobe signal inputted through the strobe pad.

In still another exemplary aspect of the present invention, a semiconductor memory apparatus may include: a bonding pad; and a control signal pad, wherein the semiconductor memory apparatus receives a control signal through the control signal pad in a first operation mode and receives a bonding signal instead of the control signal through the control signal pad in second and third operation modes.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
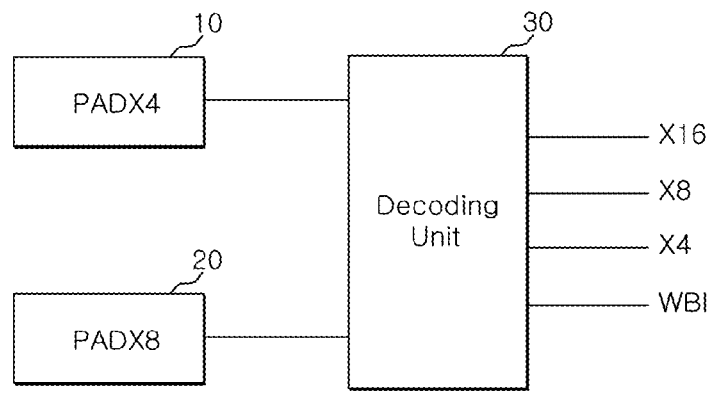
FIG. 1 is a diagram schematically illustrating the configuration of a conventional semiconductor memory apparatus.

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 2:
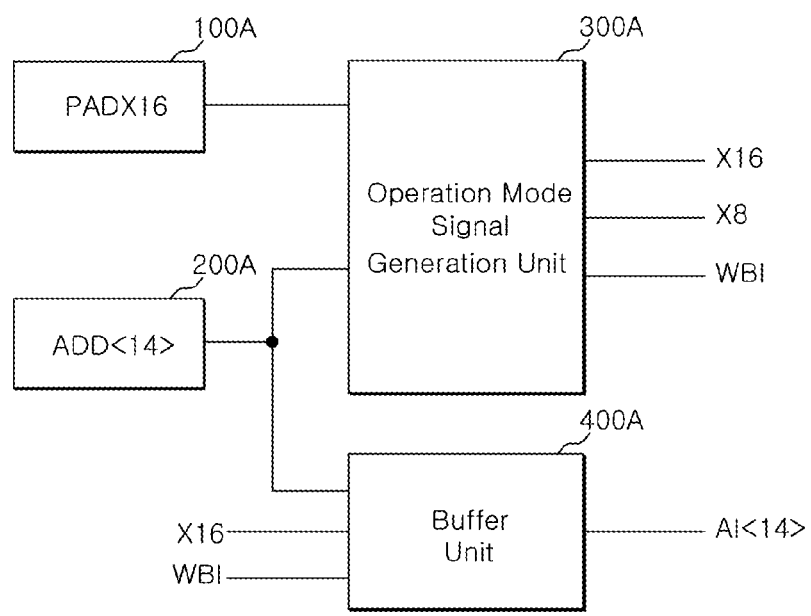
FIG. 2 is a diagram schematically illustrating the configuration of a semiconductor memory apparatus in accordance with an embodiment of the present invention.

FIG. 2 is a diagram schematically illustrating the configuration of a semiconductor memory apparatus in accordance with an embodiment of the present invention. In FIG. 2, the semiconductor memory apparatus 1 may include one bonding pad 100A, one address pad 200A, and an operation mode signal generation unit 300A. The semiconductor memory apparatus 1 is configured to receive a bonding signal PADX16 through the bonding pad 100A, and receive an address signal ADD<14> through the address pad 200A. The operation mode signal generation unit 300A generates first to third operation mode signals X8, X16 and WBI which designate first to third operation modes in response to the bonding signal PADX16 and the address signal ADD<14>.

The operation mode of the semiconductor memory apparatus 1 is determined based on the number of data bits simultaneously inputted or outputted through one read or write operation. Further, the operation mode of the semiconductor memory apparatus 1 is determined depending upon whether or not to perform a wafer burn-in test. In the embodiment of the present invention, the first operation mode may mean an X8 input/output mode, the second operation mode may mean an X16 input/output mode, and the third operation mode may mean a wafer burn-in test mode.

In the embodiment of the present invention, the address signal ADD<14> may be a signal which is used for a normal operation of the semiconductor memory apparatus 1 in the first operation mode but is not used in the normal operation of the semiconductor memory apparatus 1 in the second and third operation modes. In the present embodiment, the normal operation may include all operations except the operation of determining the operation mode of the semiconductor memory apparatus 1. The semiconductor memory apparatus 1 typically receives and uses a plurality of address signals for inputting and outputting data. Depending on an operation mode of the semiconductor memory apparatus 1, some of the address signals are never used in the semiconductor memory apparatus 1. Therefore, as described above, by generating the operation mode signals for designating the plurality of operation modes by using the address pad which is not used depending on an operation mode, it is possible to reduce the number of bonding pads which are necessary for designating the plurality of operation modes. That is to say, in the conventional art, in order to respectively designate the first to third operation modes, the two bonding signals PADX4 and PADX8 should be received from the two bonding pads 10 and 20 (see FIG. 1). However, in the semiconductor memory apparatus 1 in accordance with the embodiment of the present invention, the first to third operation mode signals X8, X16 and WBI for designating the first to third operation modes are generated in response to the bonding signal PADX16 received through the one bonding pad 100A and the address signal ADD<14> inputted through the address pad 200A. It is to be appreciated that, since the address pad 200A should be presented in the semiconductor memory apparatus 1 for the first operation mode, one bonding pad may be eliminated to set the second and third operation modes when compared to the conventional art.

In FIG. 2, the semiconductor memory apparatus 1 may further include a buffer unit 400A. The buffer unit 400A is configured to receive the second and third operation mode signals X16 and WBI and the address signal ADD<14>. The buffer unit 400A is configured to block the transmission of the address signal ADD<14> when one of the second and third operation mode signals X16 and WBI is enabled. If both of the second and third operation mode signals X16 and WBI are disabled, the buffer unit 400A buffers the address signal ADD<14> and provides an internal address signal AI<14>. Because the address signal ADD<14> is used in the first operation mode, that is, the X8 input/output mode, but is not used in the second and third operation modes, that is, the X16 input/output mode and the wafer burn-in test mode, the buffer unit 400A is configured not to provide the address signal ADD<14> as the internal address signal AI<14> in the second and third operation modes, but to provide the address signal ADD<14> as the internal address signal AI<14> only in the first operation mode.

Figure 3:
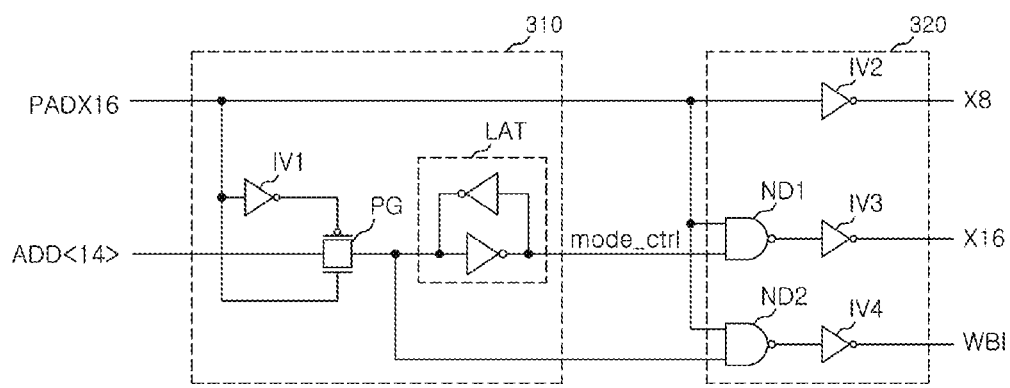
FIG. 3 is a circuit diagram illustrating the configuration of an exemplary embodiment of the operation mode signal generation unit shown in FIG. 2.

FIG. 3 is a circuit diagram illustrating the configuration of an exemplary embodiment of the operation mode signal generation unit shown in FIG. 2. As shown in FIG. 3, the operation mode signal generation unit 300A may include a mode control signal generation section 310 and a mode decoding section 320. The mode control signal generation section 310 generates a mode control signal mode_ctrl based on the address signal ADD<14> in response to the bonding signal PADX16. For example, when the bonding signal PADX16 is at a first level, the mode control signal generation section 310 does not generate the mode control signal mode_ctrl, and when the bonding signal PADX16 is at a second level, the mode control signal generation section 310 generates the mode control signal mode_ctrl depending upon the level of the address signal ADD<14>.

The mode decoding section 320 may receive the bonding signal PADX16 and the mode control signal mode_ctrl. The mode decoding section 320 decodes the bonding signal PADX16 and the mode control signal mode_ctrl and generates the first to third operation mode signals X8, X16 and WBI. The mode decoding section 320 is configured to enable one of the first to third operation mode signals X8, X16 and WBI according to the levels of the bonding signal PADX16 and the mode control signal mode_ctrl.

As shown in FIG. 3, the mode control signal generation section 310 may include a first inverter IV1, a pass gate PG and a latch stage LAT. The first inverter IV1 inverts the bonding signal PADX16. The pass gate PG receives the bonding signal PADX16 and the output of the first inverter IV1 and determines whether to pass the address signal ADD<14>. The pass gate PG disallows or allows the transmission of the address signal ADD<14> in response to the bonding signal PADX16 and the output of the first inverter IV1. The latch stage LAT latches the output of the pass gate PG and generates the mode control signal mode_ctrl. Accordingly, the mode control signal generation section 310 generates the mode control signal mode_ctrl which is dependent upon the level of the address signal ADD<14> when the bonding signal PADX16 has a high level.

As shown FIG. 3, the mode decoding section 320 may include first and second NAND gates ND1 and ND2, and second to fourth inverters IV2 to IV4. The first NAND gate ND1 receives the bonding signal PADX16 and the mode control signal mode_ctrl. The second NAND gate ND2 receives the bonding signal PADX16 and the address signal ADD<14> which has passed through the pass gate PG. The second inverter IV2 inverts the bonding signal PADX16 and generates the first operation mode signal X8. The third inverter IV3 inverts the output of the first NAND gate ND1 and generates the second operation mode signal X16. The fourth inverter IV4 inverts the output of the second NAND gate ND2 and generates the third operation mode signal WBI.

Operations of the semiconductor memory apparatus 1 in accordance with the embodiment of the present invention will be described with reference to the following table.

| PADX16 | ADD<14> | Operation Mode Signal |
|---|---|---|
| L | Don't care | X8 |
| L | <Use address> | X8 |
| H | L | X16 |
| H | H | WBI |

As described above, the semiconductor memory apparatus 1 may receive the bonding signal PADX16 through the bonding pad 100A and receive the address signal ADD<14> through the address pad 200A. The operation mode signal generation unit 300A may enable the first operation mode signal X8 regardless of the address signal ADD<14> when the bonding signal PADX16 has a low level. At this time, since the address signal ADD<14> is buffered by the buffer unit 400A and is provided as the internal address signal AI<14>, the address signal ADD<14> may be used during the operation of the semiconductor memory apparatus 1 in the first operation mode.

When the bonding signal PADX16 has a high level, the operation mode signal generation unit 300A enables one of the second and third operation mode signals X16 and WBI depending upon the level of the address signal ADD<14>. In other words, if the address signal ADD<14> has a low level, the mode control signal mode_ctrl has a high level and the second operation mode signal X16 is enabled, and if the address signal ADD<14> has a high level, the third operation mode signal WBI is enabled.

If the bonding signal PADX16 has the low level, the semiconductor memory apparatus 1 is designated to operate in the first operation mode. If the bonding signal PADX16 has the high level, because the semiconductor memory apparatus 1 does not use the address signal ADD<14> as an address signal, the address pad 200A for receiving the address signal ADD<14> is bonded to receive a bonding signal instead of the address signal ADD<14>, and the semiconductor memory apparatus 1 may be designated to operate in one of the second and third operation modes. Or, the address signal ADD<14> inputted through the address pad 200A may be used in designating the operation mode.

Figure 4:
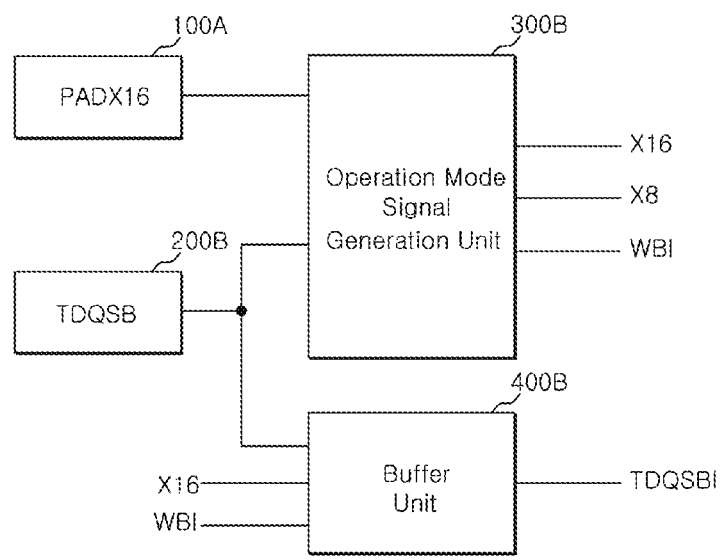
FIG. 4 is a diagram schematically illustrating the configuration of a semiconductor memory apparatus in accordance with another embodiment of the present invention.

FIG. 4 is a diagram schematically illustrating the configuration of a semiconductor memory apparatus in accordance with another embodiment of the present invention. As shown FIG. 4, the semiconductor memory apparatus 2 may include one bonding pad 100A, one strobe pad 200B, and an operation mode signal generation unit 300B. The semiconductor memory apparatus 2 receives a bonding signal PADX16 through the one bonding pad 100A, and receives a strobe signal TDQSB through the strobe pad 200B. The operation mode signal generation unit 300B generates first to third operation mode signals X8, X16 and WBI which determine its operation mode among the first to third operation modes in response to the bonding signal PADX16 and the strobe signal TDQSB.

Similar to the semiconductor memory apparatus 1 in accordance with the aforementioned embodiment of the present invention, the first to third operation modes may mean an X8 input/output mode, an X16 input/output mode, and a wafer burn-in test mode, respectively. Similar to the address signal ADD<14>, the strobe signal TDQSB may be a signal which is used in the first operation mode, that is, the X8 input/output mode, but is not used in the second and third operation modes, that is, the X16 input/output mode and the wafer burn-in test mode. The strobe signal TDQSB is a signal which may be used in data input/output operations in the second operation mode. Similar to the address signal ADD<14>, the strobe signal TDQSB may be used to designate one of the first to third operation modes.

The operation mode signal generation unit 300B may have the same configuration as the operation mode signal generation unit 300A shown in FIG. 3 except that the operation mode signal generation unit 300B receives the strobe signal TDQSB instead of the address signal ADD<14>.

In FIG. 4, the semiconductor memory apparatus 2 in accordance with another embodiment of the present invention may further include a buffer unit 400B. Similar to the buffer unit 400A shown in FIG. 2, the buffer unit 400B may be configured to buffer the strobe signal TDQSB and provide an internal strobe signal TDQSBI in the first operation mode but not to provide the strobe signal TDQSB as the internal strobe signal TDQSBI in response to the second and third operation mode signals X16 and WBI in the second and third operation modes.

Accordingly, similar to the semiconductor memory apparatus 1 shown in FIG. 2, the semiconductor memory apparatus 2 in accordance with another embodiment of the present invention may generate the operation mode signals X8, X16 and WBI for designating one of a plurality of operation modes, using the bonding signal PADX16 inputted through the one bonding pad 100A and the strobe signal TDQSB inputted through the one strobe pad 200B, and accordingly, the number of bonding pads necessary for designating the plurality of operation modes can be reduced.

In the embodiments of the present invention, the address signal ADD<14> and the strobe signal TDQSB mean signals which are respectively inputted through the address pad 200A and the strobe pad 200B. That is to say, in the present specification, the signal received through the address pad 200A is referred to as the address signal ADD<14>, and the signal received through the strobe pad 200B is referred to as the strobe signal TDQSB.

Figure 5:
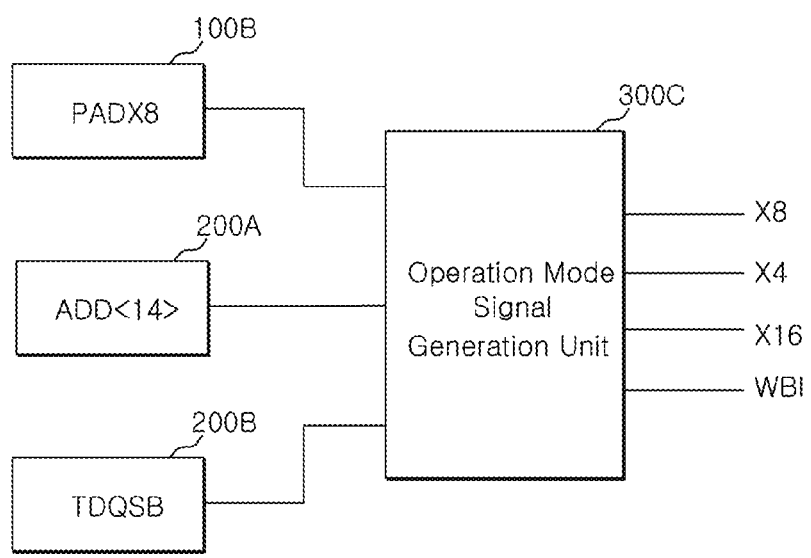
FIG. 5 is a diagram schematically illustrating the configuration of a semiconductor memory apparatus in accordance with another embodiment of the present invention.

FIG. 5 is a diagram schematically illustrating the configuration of a semiconductor memory apparatus in accordance with another embodiment of the present invention. In FIG. 5, the semiconductor memory apparatus 3 includes one bonding pad 100B, one address pad 200A, one strobe pad 200B and an operation mode signal generation unit 300C. The semiconductor memory apparatus 3 receives a bonding signal PADX8 through the bonding pad 100B, receives an address signal ADD<14> through the address pad 200A, and receives a strobe signal TDQSB through the strobe pad 200B. The operation mode signal generation unit 300C generates first to fourth operation mode signals X8, X4, X16 and WBI which determine first to fourth operation modes, in response to the bonding signal PADX8, the address signal ADD<14> and the strobe signal TDQSB.

In the present embodiment, the first to fourth operation mode signals X8, X4, X16 and WBI respectively designate an X8 input/output mode, an X4 input/output mode, an X16 input/output mode and a wafer burn-in test mode. In the present embodiment, the address signal ADD<14> may be a signal which is used for a normal operation of the semiconductor memory apparatus 3 in the first and second operation modes but is not used for the normal operation of the semiconductor memory apparatus 3 in the third and fourth operation modes. Also, the strobe signal TDQSB may be a signal which is used for a normal operation of the semiconductor memory apparatus 3 in the first operation mode but is not used for the normal operation of the semiconductor memory apparatus 3 in the second to fourth operation modes. In the semiconductor memory apparatus 3 in accordance with the embodiment of the present invention, since the plurality of operation mode signals X8, X4, X16 and WBI are generated by the signals used for respective operation modes, for example, the address signal and the strobe signal ADD<14> and TDQSB and the bonding signal received through one bonding pad, for example, one of the bonding signals PADX8 and PADX16, the plurality of operation modes may be designated in such a way as to reduce the number of bonding pads when compared to the conventional art.

Operations of the semiconductor memory apparatus 3 shown in FIG. 5 will be described below with reference to the following table.

| PADX8 | TDQSB | ADD<14> | Operation Mode Signal |
|---|---|---|---|
| L | Don't care <Use TDQSB> | Don't care <Use address> | X8 |
| H | L | Don't care <Use address> | X4 |
| H | H | L | X16 |
| H | H | H | WBI |

If the bonding signal PADX8 inputted through the bonding pad 100B has a low level, the operation mode signal generation unit 300C may designate the X8 input/output mode by enabling the first operation mode signal X8 regardless of the levels of the strobe signal TDQSB and the address signal ADD<14>. The strobe signal TDQSB and the address signal ADD<14> may be used during the X8 input/output mode of the semiconductor memory apparatus 3.

If the bonding signal PADX8 has a high level and the strobe signal TDQSB has a low level, the operation mode signal generation unit 300C may designate the X4 input/output mode by enabling the second operation mode signal X4 regardless of the level of the address signal ADD<14>. Since the semiconductor memory apparatus 3 does not use the strobe signal TDQSB in the X4 input/output mode as a strobe signal, the semiconductor memory apparatus 3 may be set to operate under the X4 input/output mode by bonding the strobe pad 200B. The address signal ADD<14> may be used as an address signal in the X4 input/output mode of the semiconductor memory apparatus 3.

If the bonding signal PADX8, the strobe signal TDQSB, and the address signal ADD<14> has a high level, a high level, and a low level, respectively, the operation mode signal generation unit 300C may designate the X16 input/output mode by enabling the third operation mode signal X16. Since the semiconductor memory apparatus 3 does not use the strobe signal TDQSB and the address signal ADD<14> in the X16 input/output mode, the semiconductor memory apparatus 3 may be set to operate under the X16 input/output mode by bonding the strobe pad 200B and the address pad 200A.

When the bonding signal PADX8, the strobe signal TDQSB and the address signal ADD<14> all have high levels, the operation mode signal generation unit 300C may designate the wafer burn-in test mode by enabling the fourth operation mode signal WBI. Since the semiconductor memory apparatus 3 does not use the strobe signal TDQSB and the address signal ADD<14> in the wafer burn-in test mode, the semiconductor memory apparatus 3 may be set to operate under the wafer burn-in test mode by bonding the strobe pad 200B and the address pad 200A.

A person skilled in the art will readily appreciate that the embodiments of the present invention may be modified, changed or replaced in a variety of ways. That is to say, the logic combination of the operation mode signal generation unit may be changed and modified in various shapes, and the strobe signal and the address signal may be replaced with various signals as the occasion demands. Also, logic circuits for logically combining the signals may be realized in a variety of ways.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
   a bonding pad;
   a control signal pad; and
   an operation mode signal generation unit configured to generate a plurality of operation mode signals in response to a bonding signal inputted through the bonding pad and a control signal inputted through the control signal pad,
   wherein the control signal is used in a normal operation of the semiconductor memory apparatus in a first input/output mode and but not used in the normal operation of the semiconductor memory apparatus in a second input/output mode or a wafer burn-in test mode, and
   the plurality of operation mode signals designate the first input/output mode, the second input/output mode and the wafer burn-in test mode.

2. The semiconductor memory apparatus according to claim 1, wherein the plurality of operation mode signals include a first operation mode signal for designating the first input/output mode, a second operation mode signal for designating the second input/output mode, and a third operation mode signal for designating the wafer burn-in test mode.

3. The semiconductor memory apparatus according to claim 1, wherein the control signal is any one of an address signal and a strobe signal.

4. The semiconductor memory apparatus according to claim 2, further comprising:
   a buffer unit configured to block input of the control signal in response to the second operation mode signal or the third operation mode signal.

5. The semiconductor memory apparatus according to claim 1, wherein the operation mode signal generation unit comprises:
   a mode control signal generation section configured to generate a mode control signal from the control signal in response to the bonding signal; and
   a mode decoding section configured to generate the plurality of operation mode signals in response to the bonding signal and the mode control signal.

6. The semiconductor memory apparatus according to claim 5, wherein the mode control signal generation section generates the mode control signal depending upon a level of the control signal only when the bonding signal has a predetermined level.

7. A semiconductor memory apparatus comprising:
a bonding pad;
an address pad;
a strobe pad; and
an operation mode signal generation unit configured to determine first to fourth operation modes in response to a bonding signal inputted through the bonding pad, an address signal inputted through the address pad, and a strobe signal inputted through the strobe pad.

8. The semiconductor memory apparatus according to claim 7, wherein the operation mode signal generation unit generates a first operation mode signal which designates the first operation mode, regardless of the address signal and the strobe signal when the bonding signal has a first level.

9. The semiconductor memory apparatus according to claim 8, wherein the operation mode signal generation unit determines one of the second to fourth operation modes in response to the address signal and the strobe signal when the bonding signal has a second level.

10. The semiconductor memory apparatus according to claim 9, wherein the operation mode signal generation unit generates a second operation mode signal which designates the second operation mode, regardless of the address signal when the bonding signal has the second level and the strobe signal has the second level.

11. The semiconductor memory apparatus according to claim 9, wherein the operation mode signal generation unit generates a third operation mode signal which designates the third operation mode, when the bonding signal has the second level, the strobe signal has the second level and the address signal has the first level.

12. The semiconductor memory apparatus according to claim 9, wherein the operation mode signal generation unit generates a fourth operation mode signal which designates the fourth operation mode, when the bonding signal has the second level, the strobe signal has the second level and the address signal has the second level.

13. The semiconductor memory apparatus according to claim 7, wherein the strobe signal is used in the first operation mode and is not used in the second to fourth operation modes.

14. The semiconductor memory apparatus according to claim 7, wherein the address signal is used in the first and second operation modes and is not used in the third and fourth operation modes.

15. The semiconductor memory apparatus according to claim 7, wherein each of the first to fourth operation modes is one of an X4 input/output mode, an X8 input/output mode, an X16 input/output mode, and a wafer burn-in test mode.

16. A semiconductor memory apparatus comprising:
a bonding pad;
a control signal pad;
a mode control signal generation section configured to generate a mode control signal from a signal inputted through the control signal pad in response to a signal inputted through the bonding pad; and
a mode decoding section configured to decode the signals inputted through the bonding pad and the control signal pad and the mode control signal, and generate first to third operation mode signals.

17. The semiconductor memory apparatus according to claim 16, wherein the first operation mode is a first input/output mode, the second operation mode is a second input/output mode, and a third operation mode is a wafer burn-in test mode.

* * * * *